United States Patent [19]

Takigawa et al.

[11] 4,424,448

[45] Jan. 3, 1984

[54] ELECTRON BEAM APPARATUS

[75] Inventors: Tadahiro Takigawa, Inagi; Isao Sasaki, Sodegaura, both of Japan

[73] Assignee: Tokyo Shibaura Denki Kabushiki Kaisha, Kawasaki, Japan

[21] Appl. No.: 216,948

[22] Filed: Dec. 16, 1980

[30] Foreign Application Priority Data

Dec. 26, 1979 [JP] Japan .................................. 54/168169
Mar. 21, 1980 [JP] Japan .................................. 55/35833

[51] Int. Cl.³ ............................ H01J 3/08; H01J 3/12
[52] U.S. Cl. .................................. 250/397; 250/494.2
[58] Field of Search ........... 250/397, 396 R, 396 MC, 250/492.2; 219/121 EA, 121 ER; 315/307

[56] References Cited

U.S. PATENT DOCUMENTS 3,838,313 9/1974 Anderson ...................... 219/121 EA
4,000,440 12/1976 Hall et al. ............................ 250/397

FOREIGN PATENT DOCUMENTS 17200 2/1977 Japan ................................... 250/397
127272 10/1979 Japan ................................... 250/397

OTHER PUBLICATIONS

Proceedings Microcircuit Engineering '79, "Comparitive Measurements on the High Brightness LaB6 Electron Gun Using Sintered and Single Crystal Cathode Materials" by F. J. Hohn et al., Sep. 1979.

Primary Examiner—Alfred E. Smith
Assistant Examiner—Carolyn E. Fields
Attorney, Agent, or Firm—Oblon, Fisher, Spivak, McClelland & Maier

[57] ABSTRACT

An electron beam apparatus comprises an electron gun having a cathode consisting of single-crystal lanthanum hexaboride and a plurality of electron lenses for projecting the cross-over image of an electron beam emitted from the electron gun as a reduced-scale image onto a sample. It further comprises a circuit for measuring the brightness and shape of the cross-over image projected onto the sample and the emission pattern of the electron beam emitted from the electron gun, and a circuit for applying a bias voltage, with which the cross-over image has a desired brightness and is round and the emission pattern is anisotropic, to the electron gun.

14 Claims, 21 Drawing Figures

ELECTRON BEAM APPARATUS

BACKGROUND OF THE INVENTION

1. Field of the Invention

This invention relates to an electron beam apparatus and, more particularly, to an electron beam apparatus which can always be used under an optimum bias condition.

2. Description of the Prior Art

Recently, apparatus incorporating electron beam apparatus, for instance electron beam exposure apparatus and scanning type electronic microscopes, have been extensively used. The electron gun of the electron beam apparatus generally has a hair-pin type tungsten cathode. This cathode, however, is inferior in brightness and life. From this ground, it is a recent trend to use electron guns having single-crystal chip cathodes of lanthanum hexaboride (LaB$_6$) and like materials. The characteristics of the electron beam emitted from the single-crystal chip cathode generally depend upon the crystal axis orientation of the chip, the radius of curvature of a tip portion of the chip, the vertical angle of the tip portion, etc. Particularly, the brightness depends upon the chip temperature and bias voltage. This means that the optimum bias condition is changed with a change of the chip temperature. Since the chip temperature is prone to change even during the use of the apparatus, it is difficult to set the bias condition afresh every time the chip temperature is changed.

SUMMARY OF THE INVENTION

An object of the invention is to provide an electron beam apparatus, in which the bias is set to meet an automatically determined optimum bias condition.

This object is realized by an electron beam apparatus which comprises an electron gun having a single-crystal cathode, an optical system for converging an electron beam emitted from the electron gun and projecting a converged beam image onto a sample, means for measuring electron beam through various parts of the optical system and a bias setting means for setting a bias condition for the electron gun according to the results of measurement in the measuring means.

BRIEF DESCRIPTION OF THE DRAWINGS

This invention can be more fully understood from the following detailed description when taken in conjunction with the accompanying drawings, in which.

DETAILED DESCRIPTION OF THE PREFERRED EMBODIMENTS

Figure 1:
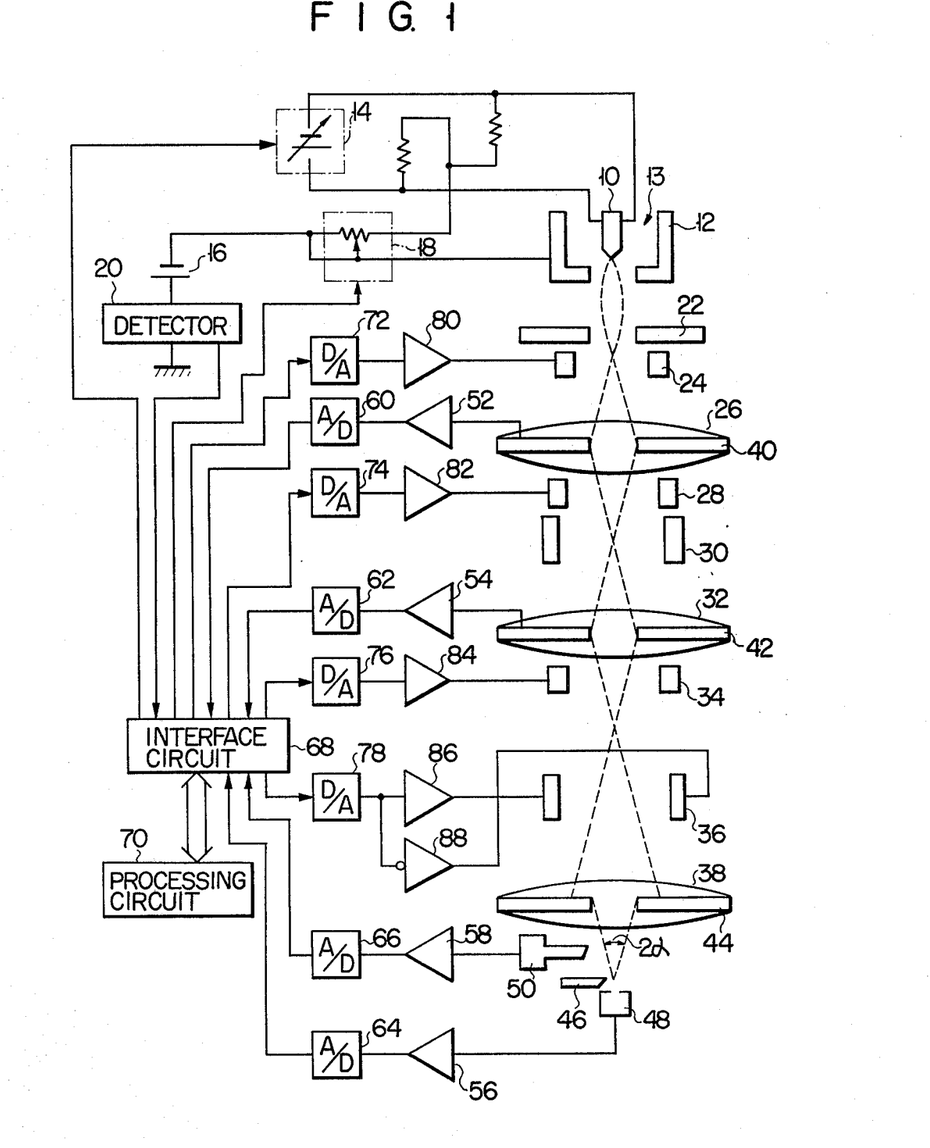
FIG. 1 is a schematic showing an embodiment of the electron beam apparatus according to the invention.

Now, preferred embodiments of the electron beam apparatus according to the invention will be described with reference to the accompanying drawings. As a first embodiment, an electron beam apparatus of the type forming a fine spot as a reduced-space cross-over image, which is used for an electron beam exposure system or the like, will be described. FIG. 1 outlines the construction of the apparatus. A cathode 10 having a sharpened tip and a wehnelt electrode 12 disposed to surround the cathode 10 constitute an electron gun 13. The cathode 10 consists of single-crystal lanthanum hexaboride (LaB$_6$). A heater power supply 14 which supplies a variable voltage is connected to the cathode 10. A high voltage power supply 16 is connected through a variable bias resistor 18 to the wehnelt electrode 12. It is also connected to an emission current detector 20. An anode 22 is disposed ahead of the wehnelt electrode 12. A first condenser axis adjustment coil 24, a first condenser 26, a second condenser axis adjustment coil 28, a blanking electrode 30, a second condenser 32, an objective lens axis adjustment electrode 34 and an objective lens 38 are disposed in the mentioned order along the path of electron beam emitted from the cathode 10 from the side of the anode 22. The first and second condensers 26 and 32 have apertures 40 and 42 provided for preventing the scattering and also detecting the electron beam, and the objective lens 237 has an aperture 44 for preventing the scattering. The current flowing the apertures 40 and 42 are coupled through amplifiers 52 and 54 to A/D (analog-to-digital) converters 60 and 62, respectively.

A knife edge 46 is disposed over the surface of a sample, on which a cross-over image is focused by the objective lens 38, and below the knife edge 46 a Faraday cup 48 is disposed. A reflected electron detector 50 is disposed at an intermediate position between the knife edge 46 and objective lens 38. The output signals from the Faraday cup 48 and reflected electron detector 50 are coupled through amplifiers 56 and 58 to A/D converters 64, 66, respectively. The output signals from the A/D coverters 60, 62, 64 and 66 are coupled through an interface circuit 68 to a processing circuit 70. The output signal of the emission current detector 20 is also coupled through the interface circuit 68 to the processing circuit 70.

The output signal of the processing circuit 70 is coupled through the interface circuit 68 to D/A (digital-to-analog) converters 72, 74, 76 and 78, a control terminal of the heater power supply 14 and a control terminal of the bias resistor 18. The output signals of the D/A converters 72, 74 and 76 are coupled through amplifiers 80, 82 and 84 to the axis adjustment coils 24, 28 and 34, respectively, and the output signal of the D/A converter 78 is coupled through amplifiers 86 and 88 to the respective positive and negative terminals of the deflection electrode 36. The amplifier 88 is an inverting amplifier.

Figure 2:
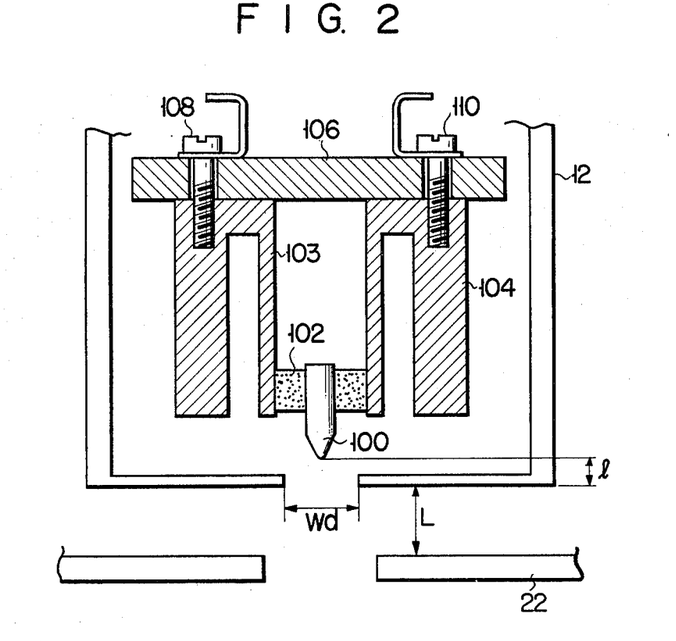
FIG. 2 is a sectional view showing an electron gun in the embodiment of FIG. 1.
Figure 3:
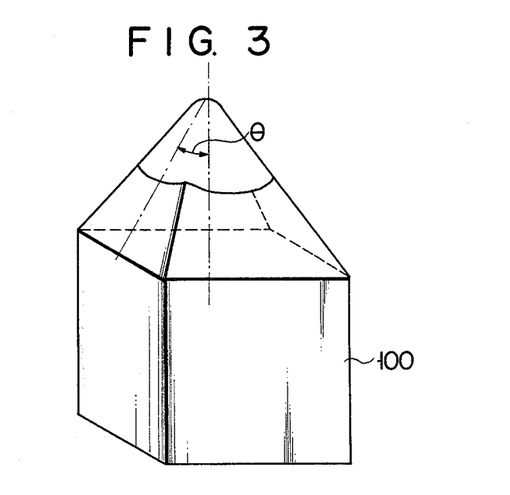
FIG. 3 is a perspective view showing a cathode in the electron gun of FIG. 2.

FIG. 2 shows the detailed construction of the electron gun used in the system of FIG. 1. This electron gun is of Vogel type. The cathode chip 100 is clamped at its opposite sides by support members 103 and 104 via heaters 102. The support member 103 and 104 are secured at its stem by screws 108 and 110 to an insulating base member 106. The cathode chip 100 is heated by energizing the heater 102 through the screws 108 and 110 and insulating support members 103 and 104. The distance between the tip of the cathode 100 and wehnelt electrode 12 is set to l, the diameter of the opening of the wehnelt electrode 12 is set to Wd, and the distance between the wehnelt electrode 12 and anode 22 is set to L. FIG. 3 shows a perspective view of the cathode chip 100. The $LaB_6$ chip 100 has a $<100>$ axis, and it is obtained by machining a cubic piece to form a pyramidal tip portion. The pyramidal tip portion is further machined into a conical form, which is then machined to form a spherical surface having a radius of curvature r. The half vertical angle of the conical portion is set to $\theta$.

The operation of this embodiment will now be described. When the cathode 10 is heated and a bias voltage is applied to the wehnelt electrode 12, an electron beam is emitted from the cathode 100. The cross-over image of the electron beam thus emitted is progressively reduced in scale through the first and second capacitors 26 and 32 and objective lens 38 before it is focused on the sample surface. It is required for the electron beam apparatus of the converted cross-over image type as described above that the brightness of the cross-over image be sufficiently high and that the cross-over image be round. Unless the brightness of the cross-over image is sufficiently high, the exposure of a resist in the electron beam exposure apparatus cannot be obtained. Also, if the cross-over image is not round but anisotropic, it is impossible to draw an accurate pattern on the resist. The principles, under which the bias condition meeting the above two requirements can be automatically set, will first be described.

Figure 4:
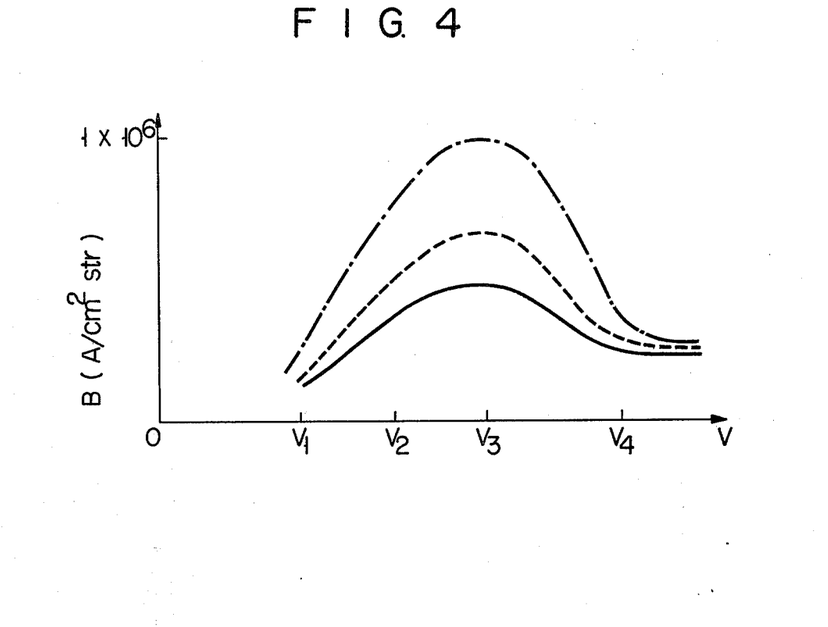
FIG. 4 is a graph showing brightness versus bias voltage characteristics illustrating the principles underlying the invention.
Figure 5A:
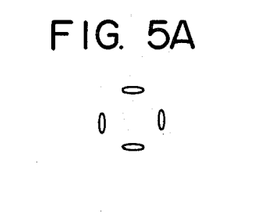
FIGS. 5A through 5D are views showing shapes of the cross-over images corresponding to different bias voltages.
Figures 5B, 5C:
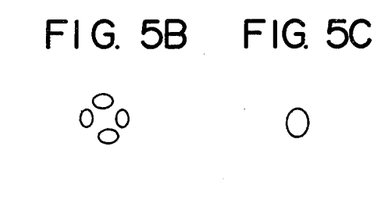
Figure 5D:
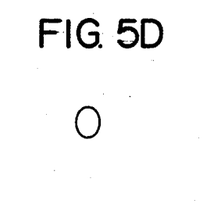
Figure 6A:
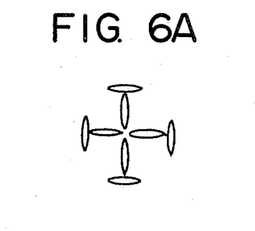
FIGS. 6A through 6D are views showing emission patterns corresponding to different bias voltages.
Figures 6B, 6C:
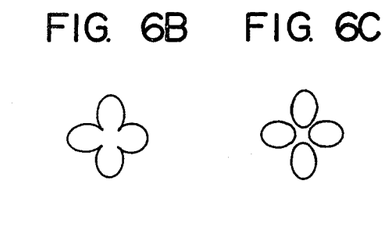
Figure 6D:
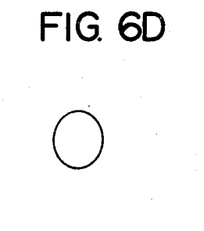

It is known that the characteristics of the electron beam depend upon the cathode chip temperature T, the bias voltage V between the wehnelt electrode and chip, the distance l between the wehnelt electrode and chip, the opening diameter Wd of the wehnelt electrode, the distance L between the wehnelt electrode and anode, the radius of curvature r of the tip of the chip, the half vertical angle $\theta$ of the chip and the crystal axis orientation of the chip. Of these parameters, L and Wd affect the brightness of the electron beam and cross-over image diameter. FIG. 4 shows the relation of the brightness B to the bias voltage V with the chip temperature T used as the third parameter. This graph is obtained with L=10 mm, Wd=1.5 mm, r=15 $\mu$m, $\theta$=45°, l=0.2 mm, and the crystal axis orientation is $<100>$. In FIG. 4, the solid line curve is obtained for T=1,400° C., the dashed line curve is obtained for T=1,500° C., and the one-dot and dashed curve is obtained for T=1,600° C. As is seen from curves, the maximum brightness does not depend upon the temperature but is given by a certain constant bias voltage $V_3$. As the bias voltage is increased beyond $V_4$, the brightness values approach to a certain value independent of the temperature. FIGS. 5A through 5D show cross-over images obtained with respective bias voltages $V_1$ to $V_4$, and FIGS. 6A through 6D show respectively corresponding emission patterns. As is shown, the cross-over image appears as four-hold symmetry patterns when $V_1 \leq V < V_3$ due to the influence of the crystal surface anisotropy of the work function of the $LaB_6$ chip, and it is a round pattern when $V_3 \leq V$. The emission pattern appears as four-hold symmetry patterns when $V_1 \leq V \leq V_3$, and it is round when $V_4 \leq V$. That the emission pattern be round is not an essential requirement for the converged cross-over image type electron beam apparatus, but is a prerequisite requirement for the apparatus of the aperture image projection type.

Figure 7A:
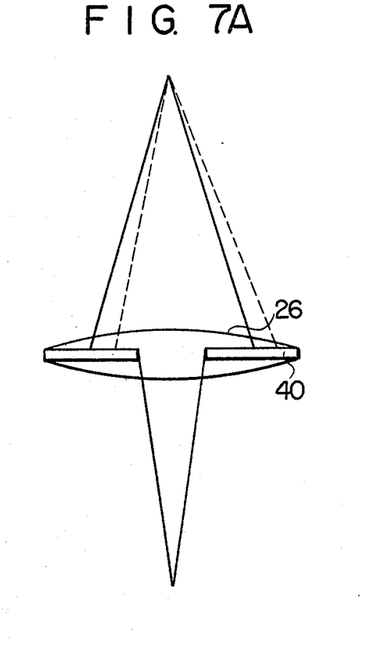
FIGS. 7A and 7B are views respectively showing the effect of deviation of electron beam in case of a round emission pattern and that in case of an anisotropic emission pattern.
Figure 7B:
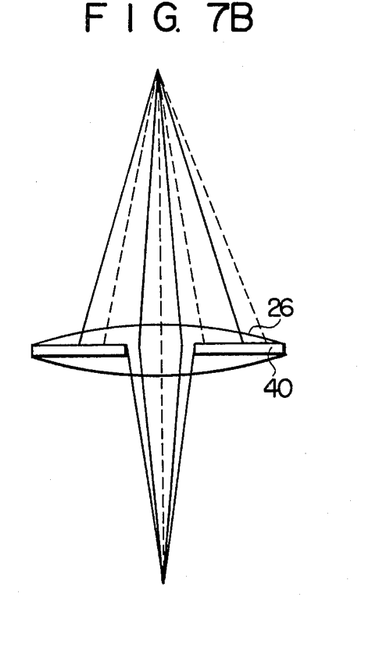

FIGS. 7A and 7B respectively show the orbit of the electron beam passing through the first condenser 26 in case of a round emission pattern (free from anisotropy) and that in case of an anisotropic emission pattern. As is shown in FIG. 7A, in case when the emission pattern is round, the dose of the electron beam passing through the aperture 40 is unchanged even with a change of the electron beam orbit, for instance from that shown by the solid lines to that shown by the dashed ines. However, in case when the emission pattern is anisotropic as shown in FIG. 7B, the dose of the electron beam passing through the aperture 40 is changed with changes of the electron beam orbit. Accordingly, an axis adjustment may be made as required when an anisotropic emission pattern is made. Also, it has been confirmed that the path of the electron beam is unchanged when the vacuum degree of the space from the electron gun 13 to the objective lens 38 is higher than $1 \times 10^{-6}$ Torr. When it is lower than $1 \times 10^{-6}$ Torr, the contamination of the space becomes noticeable and the stability of the electron beam is deteriorated.

It is to be noted here that with the bias voltage $V = V_3$, with which the brightness of the electron beam is maximum, the emission pattern is anisotropic, but the cross-over image form is round. It has been experimentally proved that this relation is independent of the radius of curvature r of the tip portion of the chip, the half vertical angle $\theta$ of the chip tip, the chip axis orientation and the distance l between the chip and wehnelt electrode. The chip axis orientation has bearing upon only the cross-over image and the emission pattern, r and $\theta$ have something to do mainly with the absolute value of the bias voltage and the degree of anisotropy of the cross-over image and emission pattern, and l has influence upon only the absolute value of the bias voltage.

Figure 8:
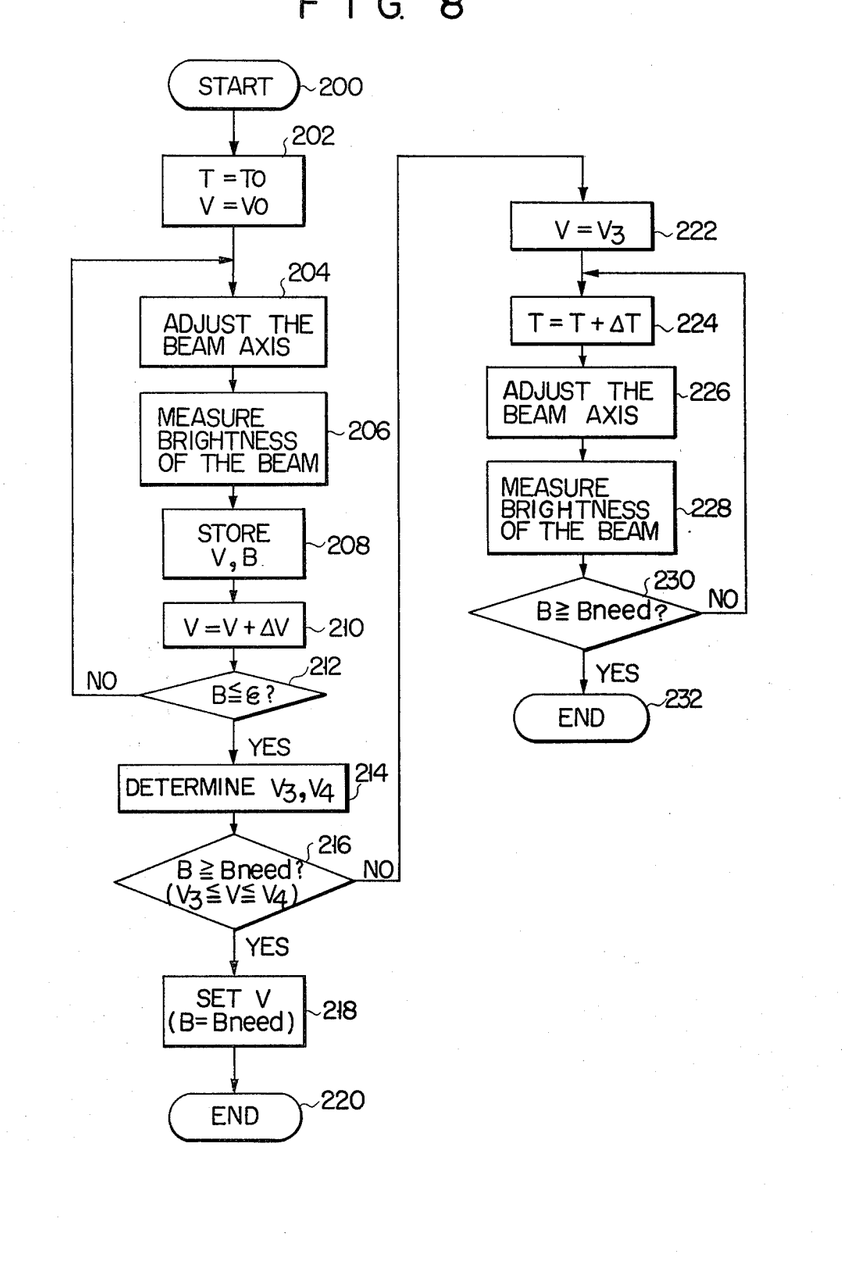
FIG. 8 is a flow chart illustrating the operation of the embodiment of FIG. 1.

Now, the processing of setting a bias voltage to a predetermined value on the basis of the principles described above will be described with reference to the flow chart of FIG. 8. In a step 200, the optical system is set to the initial state. Then, in a step 202 the chip temperature T and bias voltage V are respectively set to initial values $T_0$ and $V_0$ to start the emission of an electron beam. At this time, somewhat low values are set as $T_0$ and $V_0$. In a subsequent step 204, the beam axis is adjusted. For the dose of the electron beam passing through the apertures 40 and 42 of the respective first and second condensers 26 and 32 to be maximum, the current flowing the apertures 40 and 42 may be set to a minimum. To meet this condition, the beam is scanned two-dimensionally through the operation of the axis adjustment coils 24, 28 and 34. After the beam axis has been adjusted in this way, the brightness of the beam is measured in a step 206. The brightness is given as $$B = 4I/(\pi ad)^2 \tag{1}$$

where d is the diameter of the cross-over image, $a$ is the half vertical angle of convergence of the electron beam, and I is the beam current. The diameter d is detected from the rising of reflected electron signal produced when the electron beam passes by the knife edge 46, and the current I is detected by the Faraday cup 48.

When B is obtained, the data of V and B are stored in a memory within the processing unit 70 in a step 208. In a subsequent step 210, the bias voltage V is incremented by $\Delta V$, and in a step 212 whether the resultant bias voltage V is not less than $V_4$, i.e., whether the brightness B is not greater than a certain constant value $\xi$, is checked. If B is above $\xi$, the processing returns to the step 204. If B is not above $\xi$, it means that the brightness B versus bias voltage V characteristic for the chip temperature $T_0$ as shown in FIG. 4 is obtained. From this characteristic, the bias voltage $V_3$ corresponding to the maximum brightness and the bias voltage $V_4$ corresponding to the brightness $\xi$ are determined in a step 214. In a subsequent step 216, whether a desired brightness $B_{need}$ is contained within the range of brightness B corresponding to the range $V_3 \leq V \leq V_4$ of bias voltage, i.e., whether a corresponding bias voltage is contained therein, is checked. If the bias voltage V corresponding to the desired brightness $B_{need}$ is contained, this bias voltage is applied to the electron gun in a step 218, and the bias setting operation is ended in a step 220. If no bias voltage corresponding to the desired brightness $B_{need}$ is found, the bias voltage is set to $V_3$ in a step 222. Then, in a step 224 the chip temperature T is incremented by $\Delta T$, followed by adjustment of beam axis and measurement of beam brightness in respective steps 226 and 228. In a subsequent step 230, whether or not the brightness B measured meets a condition $B > B_{need}$ is checked. If $B > B_{need}$, the processing is returned to the step 224. If the condition $B > B_{need}$ is met, the bias setting processing is ended in a step 232. The bias voltage at this time is $V_3$. The processing described above is effected within the processing circuit 70. Where this processing is in force as required, the bias condition is automatically changed with a change of the chip temperature even during the operation of the electron beam apparatus, and the apparatus can thus be used always under the optimum bias condition.

Figure 9:
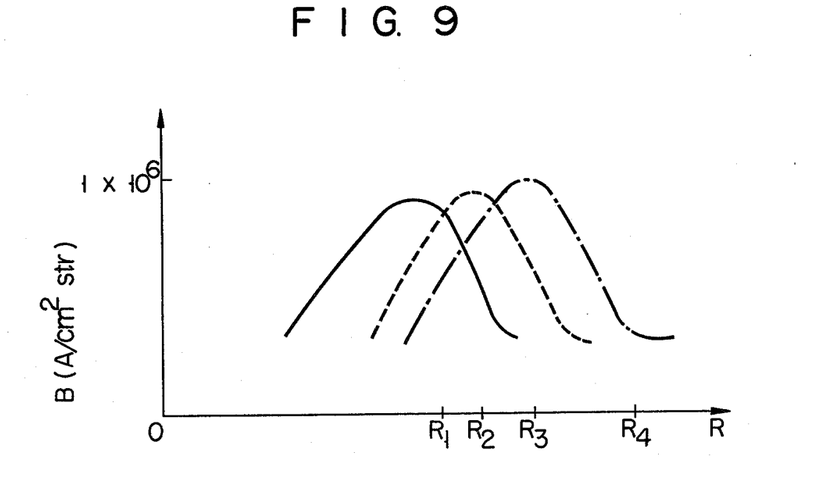
FIG. 9 is a graph showing brightness versus bias resistance characteristics.

The bias voltage V is substantially proportional to the bias resistance R. FIG. 9 shows the relation of the brightness B to the bias resistance R with the chip temperature T used as the third parameter. It will be seen that the brightness B can be controlled through the control of the bias resistance R instead of the bias voltage V. In FIG. 9, the solid line curve is obtained for T=1,400° C., the dashed line curve is obtained for T=1,500° C., and the one-dot and dashed line curve is obtained for T=1,600° C. The bias resistance values $R_1$ to $R_4$ respectively correspond to the bias voltage values $V_1$ to $V_4$ shown in FIG. 4. The values $R_1$ to $R_4$ change with the chip temperature T, so they have to be calculated afresh every time when the chip temperature T changes. The values $R_1$ to $R_4$ in FIG. 9 are obtained for T=1,600° C.

Figure 10:
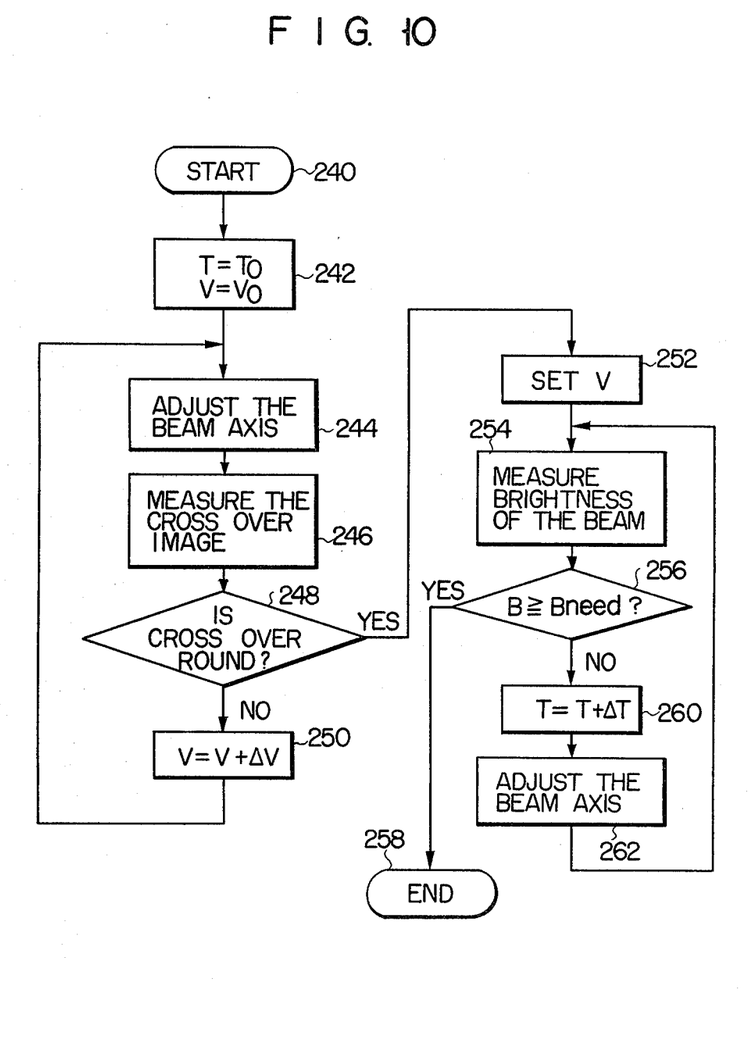
FIG. 10 is a flow chart illustrating a different example of the operation of the embodiment of FIG. 1.

Now, another example of the operation of determining the optimum bias condition for the cross-over reduction type electron beam apparatus will be described with reference to the flow chart of FIG. 10. Here, a step 240 of initializing the optical system, a step 242 of setting the chip temperature T and bias voltage V to respective initial values $T_0$ and $V_0$ and a step 244 of adjusting the beam axis are the same as in the preceding example shown in FIG. 8. In this example, the shape of the cross-over image is measured in a subsequent step 246. This measurement is obtained from the cross-over image diameter d measured in two or three directions. The cross-over image may be measured by a beam-profile detector. In a subsequent step 248, whether the cross-over image is round, i.e., whether it is not anisotropic, is checked. If it is anisotropic, the bias voltage V is incremented by $\Delta V$ in a subsequent step 250, and the operation returns to the step 244. If the cross-over image is found to be round, the processing goes to a step 252, in which the prevailing bias voltage, which is $V_3$, is set. Then, the brightness B of the cross-over image is measured in a step 254, and whether the measured brightness B is not less than a desired brightness $B_{need}$ is checked in a step 256. If B is not less than $B_{need}$, the operation is ended in a step 258. If B is less than $B_{need}$, the chip temperature T is incremented by $\Delta T$ in a step 260, and the beam axis is adjusted in a step 262, followed by the step 254 again. It will be seen that this embodiment is based upon the relations shown in FIGS. 4 and 5C for determining $V_3$ from the shape of the cross-over image and then controlling the brightness through the control of the chip temperature. Thus, the processing requires less time compared to the case of the preceding example.

Figure 11:
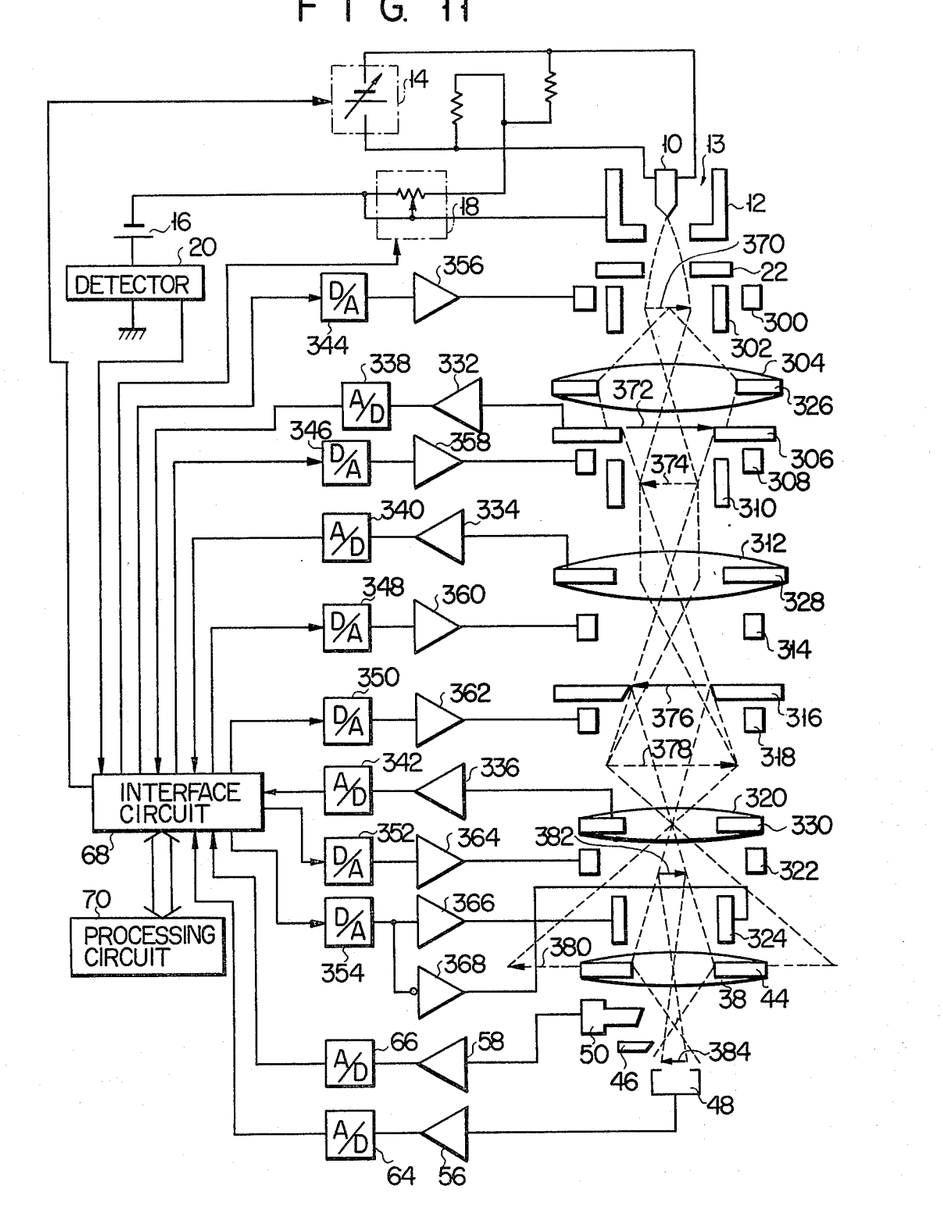
FIG. 11 is a schematic showing a second embodiment of the invention.

Now, an embodiment of the invention applied to an electron beam apparatus of the type forming a fine aperture image using the kte,uml/o/ hler illumination will be described. FIG. 11 schematically shows the construction of this embodiment. Like parts as those in FIG. 1 are designated by like reference numerals, and their description is omitted. In this embodiment, an axis adjustment coil 300, a blanking electrode 302, an illumination lens 304, a first shaping aperture 306, an axis adjustment coil 308, a deflection electrode 310, a projecting lens 312, an axis adjustment coil 314, a second shaping aperture 316, an axis adjustment coil 318, a converging lens 320, an axis adjustment coil 322 and a deflection electrode 324 are provided in the mentioned order between anode electrode 22 and objective lens 38. The illumination lens 304 has a scattering prevention aperture 326, and the projection lens 312 and converging lens 320 have respective scattering prevention/current detection apertures 328 and 330. The detected currents in the first shaping aperture 306 and scattering prevention/current detection apertures 328 and 330 are respectively coupled through amplifiers 332, 334 and 336 to A/D converters 338, 340 and 342. The outputs of the A/D converters 338, 340 and 342 are coupled through the interface circuit 68 to the processing circuit 70. The output signal of the processing circuit 70 is coupled through the interface circuit 68 to D/A converters 344, 346, 348, 350, 352 and 354. The output signals of the D/A converters 344, 346, 348, 350 and 352 are respectively coupled through amplifiers 356, 358, 360, 362 and 364 to axis adjustment coils 300, 308, 314, 318 and 322. The output signal of the D/A converter 354 is coupled through amplifiers 366 and 368 to the positive and negatie terminals of the deflection electrode 324, respectively. The amplifier 368 is an inverting amplifier.

A first cross-over image 370 of the electron beam emitted from the electron gun 13 is formed at a position of the blanking electrode 302. This image 370 illuminates the first shaping aperture 306 through the illumination lens 304. A second cross-over image 374 is focused under the first shaping aperture 306. The first shaping aperture 372 is projected through the projection lens 312 onto the second shaping aperture 316 to form a first aperture imaage 376 thereon. The first and second shaping apertures 306 and 316 provide respective square beam sections, and thus it is possible to obtain an image of a desired rectangular form as the first aperture image 376 by disposing the first and second shaping apertures 306 and 316 with the deflection electrode 310 out of alignment by an appropriate amount from each other. The projection lens 320 also focuses a third cross-over image 378 under the second shaping aperture 316. The converging lens 320 focuses the third cross-over image 378 as a fourth cross-over image 380 on the scattering prevention aperture 44 provided within the objective lens 38, and it also focuses the first aperture image 376 as a second aperture image 382 reduced in scale. The second aperture image 382 is focused as an aperture image 384 through the objective lens 38 onto the sample surface.

The operation of this embodiment will now be described. In this embodiment, it is required that the emission pattern be round in addition to that the electron beam has a desired brightness and that the cross-over image is round. FIGS. 5A through 5D and FIGS. 6A through 6D show that the cross-over image is round if the emission pattern is round. Accordingly, in this embodiment the optimum bias condition is determined with respect to the brightness and emission pattern.

Figure 12A:
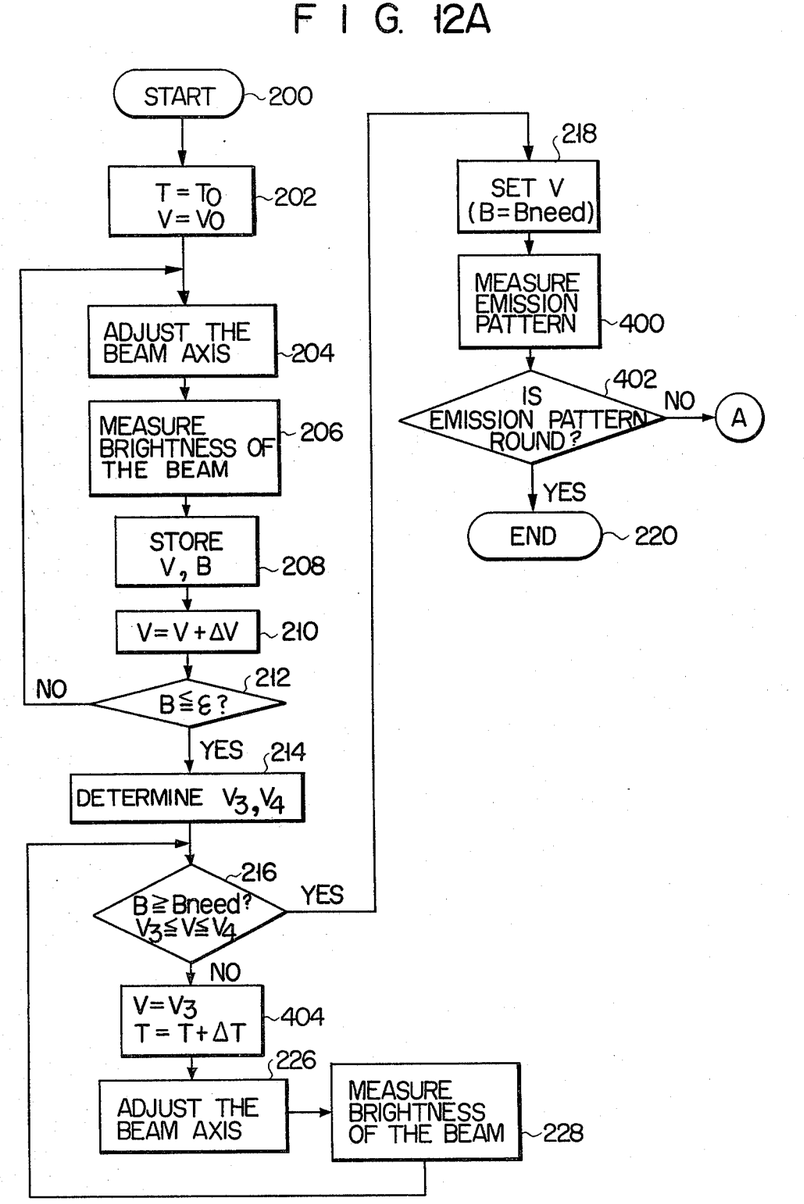
FIGS. 12A and 12B are flow charts illustrating the operation of the second embodiment.
Figure 12B:
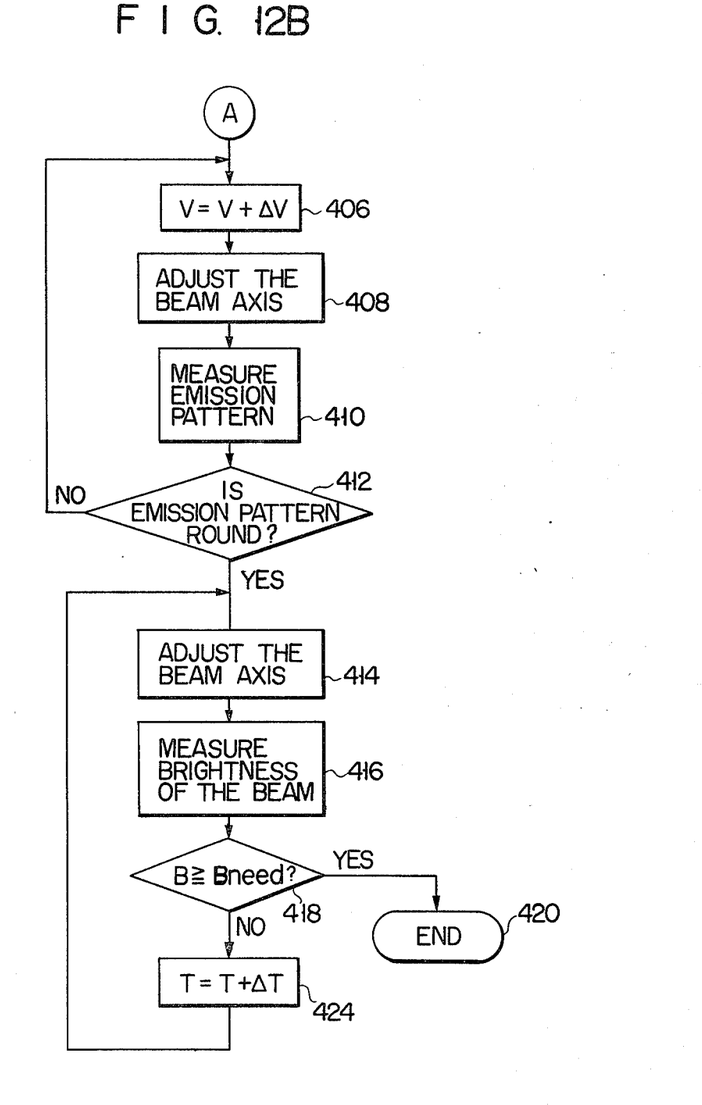

Now, the processing in the processing circuit 70 will be described with reference to the flow charts of FIGS. 12A and 12B. In these flow charts, like steps as in FIG. 8 are designated by like reference numerals, and their description is omitted here. More particularly, the processing is the same as that described before in connection with FIG. 8 up to the step 218 of setting a bias voltage corresponding to a desired brightness $B_{need}$ after obtaining a characteristic as one of those shown in FIG. 4. According to this embodiment, the emission pattern is detected in a subsequent step 400, and whether the emission pattern is round is checked in a step 402. If it is round, the processing is ended in step 220. If it is determined in the step 216 that the desired brightness is not obtained, a step 404 is executed. In the step 404, the bias voltage is set to $V_3$, and the chip temperature T is incremented by $\Delta T$, followed by the beam axis adjustment and the brightness measurements in respective steps 226 and 228 and then the step 216.

If the emission pattern is not round, the bias voltage is incremented by $\Delta V$, followed by the beam axis adjustment and the brightness measurement in respective steps 408 and 410. Then, whether the emission pattern is round is checked in a step 412. If the emission pattern is not round, the processing goes back to the step 406 to increment the bias voltage by $\Delta V$ again. The emission pattern is the more round the higher the bias voltage, but the brightness is reduced when the bias voltage is increased beyond $V_3$. Accordingly, if the emission pattern is round, the beam axis adjustment and the brightness measurement are effected in respective steps 414 and 416, and then the brightness is checked in a step 418. If the brightness is not less than the desired brightness, the processing is ended in a step 420. If the brightness is less than the desired brightness, the chip temperature is incremented by $\Delta T$ in a step 424, and the processing then returns to the step 414.

As has been shown, according to this embodiment it is possible to maintain the optimum bias condition in the electron beam apparatus of the type projecting aperture image by kohler illumination.

Figure 13:
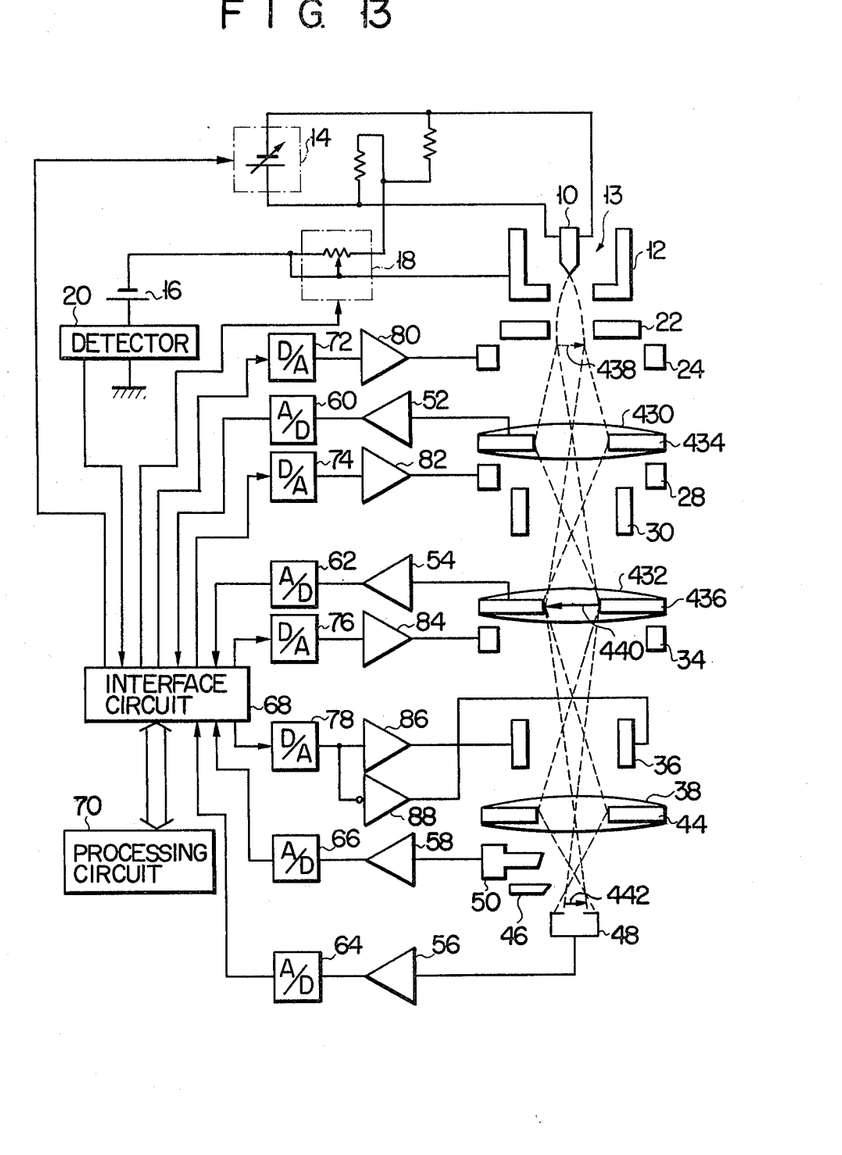
FIG. 13 is a schematic showing a third embodiment of the invention.

The invention is further applicable for use with an electron beam apparatus of the type projecting an aperture image by critical illumination as shown in FIG. 13. In FIG. 13, like parts as in FIG. 1 are designated by like reference numerals. In this embodiment, a cross-over image scale enlargement lens 430 and a condenser 432 are provided in lieu of the respective first and second condensers in the apparatus of FIG. 1. The lens 430 and condenser 432 are respectively provided with a scattering prevention aperture 434 and a shaping aperture 436. Here, a cross-over imge 438 is projected on the aperture 436 and is shaped thereat. The shaped cross-over image 440 is focused on the sample surface as an aperture image 442. The processing in processing circuit 70 is the same as that described before in connection with FIGS. 8 and 10, so it is not described here.

While in the above embodiments the cathode chip has been an $LaB_6$ single-crystal chip, any other single-crystal chip having the shape as shown in FIG. 3 has the characteristics as shown in FIGS. 5A through 5D and 6A through 6D and can thus be used as well in accordance with the invention. Examples of the other cathode electrode material are tantalum carbide (TaC), titanium carbide (TiC), zirconium carbide (ZrC), hafnium carbide (HfC) and $La_{0.3}Nd_{0.7}B_6$ crystal where neodymium is substituted for part of lanthanum. Also, while in the above embodiments the knife edge has been used for measuring the diameter of the cross-over image, it is also possible to detect the diameter by providing a fine metal wire over the sample surface and disposing the Faraday cup therebelow via an aperture.

What we claim is:

1. An electron beam apparatus comprising:
   an electron gun having a Wehnelt electrode and an cathode;
   heater means for heating the cathode;
   optical means for projecting a cross-over image of an electron beam emitted from said electron gun onto a sample;
   means for sensing a figure of the cross-over image on the sample to produce an output signal denoting the circularity of the cross-over image; and
   bias means for applying a bias voltage to said Wehnelt electrode according to the output of said sensing means.

2. An apparatus according to claim 1, in which said sensing means further includes a brightness determining means for sensing the brightness of the cross-over image, and said bias means applies a bias voltage at which the cross-over image is circular and the brightness of the cross-over image has a predetermined value.

3. An apparatus according to claim 2, in which said bias means varies said bias voltage applied to said Wehnelt electrode at a constant cathode temperature for determining the bias voltage at which the brightness of the cross-over image is maximum, and if the maximum brightness at the determined bias voltage is less than a desired brightness, said heating means increases the cathode temperature to increase the brightness of the cross-over image.

4. An apparatus according to claim 3, in which said optical means is a cross-over reduction type having an electron lens for converting a cross-over image.

5. An apparatus according to claim 3, in which said optical means comprises an aperture, a first electron lens for forming a cross-over image at the aperture, and a second electron lens for projecting the cross-over image at the aperture onto the sample.

6. An apparatus according to claim 2, in which said bias means varies a bias voltage applied to the Wehnelt electrode at a constant cathode temperature for determining the bias voltage at which the cross-over image is round, and if the brightness of the cross-over at the determined bias voltage is less than a desired brightness, said heating means increases the cathode temperature to increase the brightness of the cross-over image.

7. An apparatus according to claim 6, in which said optical means is a cross-over reduction type having an electron lens for converting a cross-over image.

8. An apparatus according to claim 6, in which said optical means comprises an aperture, a first electron lens for forming a cross-over image at the aperture, and a second electron lens for projecting the cross-over image at the aperture onto the sample.

9. An apparatus according to claim 1, in which said bias means applies a bias voltage at which an anisotropic cross-over image changes to a circular cross-over image.

10. An electron beam apparatus comprising:
an electron gun having a cathode formed of a single crystal and a Wehnelt electrode;
heater means for heating the cathode;
optical means for shaping an emission pattern of an electron beam emitted from said electron gun and projecting a shaped pattern onto a sample;
means for sensing a figure of the emission pattern on the sample to produce an output signal denoting the circularity of the emission pattern; and
bias means for applying a bias voltage to the Wehnelt electrode according to the output of said sensing means.

11. An apparatus according to claim 10, in which said sensing means further includes a brightness determining means for sensing the brightness of the emission pattern, and said bias means applies a bias voltage at which the emission pattern is circular and the brightness of the emission pattern image has a predetermined value.

12. An apparatus according to claim 11, in which said bias means varies said bias voltage applied to said Wehnelt electrode at a constant cathode temperature for determining the bias voltage at which the brightness of the emission pattern is maximum, and if the maximum brightness at the determined bias voltage is less than a desired brightness, said heating means increases the cathode temperature to increase the brightness of the emission pattern.

13. An apparatus according to claim 11, in which said bias means varies a bias voltage applied to the Wehnelt electrode at a constant cathode temperature for determining the bias voltage at which the emission pattern is round, and if the brightness of the emission pattern at the determined bias voltage is less than a desired brightness, said heating means increases the cathode temperature to increase the brightness of the emission pattern.

14. An apparatus according to claim 10, in which said optical means is a Köhler illumination type including an aperture, a first electron lens for converting an image at the aperture, and a second electron lens for converting an enlarged cross-over image onto an objective lens aperture which determines the conversion angle.

* * * * *